(12) United States Patent
Tamura et al.

(10) Patent No.: US 12,190,938 B2
(45) Date of Patent: Jan. 7, 2025

(54) MEMORY DRIVER, MEMORY SYSTEM, AND OPERATING METHOD

(71) Applicant: Taiwan Semiconductor Manufacturing Company, Ltd., Hsinchu (TW)

(72) Inventors: Motoki Tamura, Kawasaki (JP); Makoto Yabuuchi, Tokyo (JP)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 185 days.

(21) Appl. No.: 18/150,181

(22) Filed: Jan. 4, 2023

(65) Prior Publication Data

US 2023/0410883 A1    Dec. 21, 2023

Related U.S. Application Data

(60) Provisional application No. 63/380,947, filed on Oct. 26, 2022, provisional application No. 63/366,466, filed on Jun. 15, 2022.

(51) Int. Cl.
| | |
|---|---|
| *G11C 16/04* | (2006.01) |
| *G11C 11/4074* | (2006.01) |
| *G11C 11/408* | (2006.01) |
| *G11C 11/4099* | (2006.01) |
| *G11C 16/06* | (2006.01) |

(52) U.S. Cl.
CPC ...... *G11C 11/4085* (2013.01); *G11C 11/4074* (2013.01); *G11C 11/4099* (2013.01)

(58) Field of Classification Search
CPC ............ G11C 11/4085; G11C 11/4074; G11C 11/4099; G11C 5/147; G11C 8/08; G11C 11/413

See application file for complete search history.

(56) References Cited

U.S. PATENT DOCUMENTS

| | | | |
|---|---|---|---|
| 2005/0111289 A1* | 5/2005 | Kim ................... | G11C 29/1201 365/232 |
| 2012/0262993 A1* | 10/2012 | Moschiano ........ | G11C 16/0483 327/52 |

(Continued)

FOREIGN PATENT DOCUMENTS

| | | |
|---|---|---|
| EP | 0570597 A1 | 11/1993 |
| TW | 459230 B | 10/2001 |

(Continued)

*Primary Examiner* — Hien N Nguyen
(74) *Attorney, Agent, or Firm* — Finnegan, Henderson, Farabow, Garrett & Dunner, L.L.P.

(57) ABSTRACT

A memory driver includes a word line driver circuit, a reference circuit, and a bias circuit. The word line driver circuit is coupled to a word line and configured to selectively provide a reference voltage from a reference node to the word line according to an input signal. The reference circuit has a capacitor coupled to the reference node. The reference circuit is configured to store the reference voltage on the capacitor and lower the reference voltage from a first voltage level to a second voltage level when the reference voltage is provided by the word line driver circuit from the reference node to the word line. The bias circuit coupled to the reference node and configured to regulate the reference voltage at the reference node by the second voltage level.

20 Claims, 12 Drawing Sheets

(56) References Cited

U.S. PATENT DOCUMENTS

| | | | |
|---|---|---|---|
| 2013/0148445 A1* | 6/2013 | Chen | G11C 8/08 |
| | | | 365/230.06 |
| 2013/0235663 A1* | 9/2013 | Walsh | G11C 16/28 |
| | | | 365/185.21 |
| 2014/0003164 A1* | 1/2014 | Fifield | G11C 11/4085 |
| | | | 307/53 |
| 2014/0241049 A1* | 8/2014 | Vimercati | G11C 13/0004 |
| | | | 365/210.11 |
| 2021/0233582 A1* | 7/2021 | Perroni | G11C 13/0028 |
| 2021/0366532 A1 | 11/2021 | Ning | |

FOREIGN PATENT DOCUMENTS

| | | |
|---|---|---|
| TW | 200836202 A | 9/2008 |
| TW | 200842885 A | 11/2008 |

\* cited by examiner

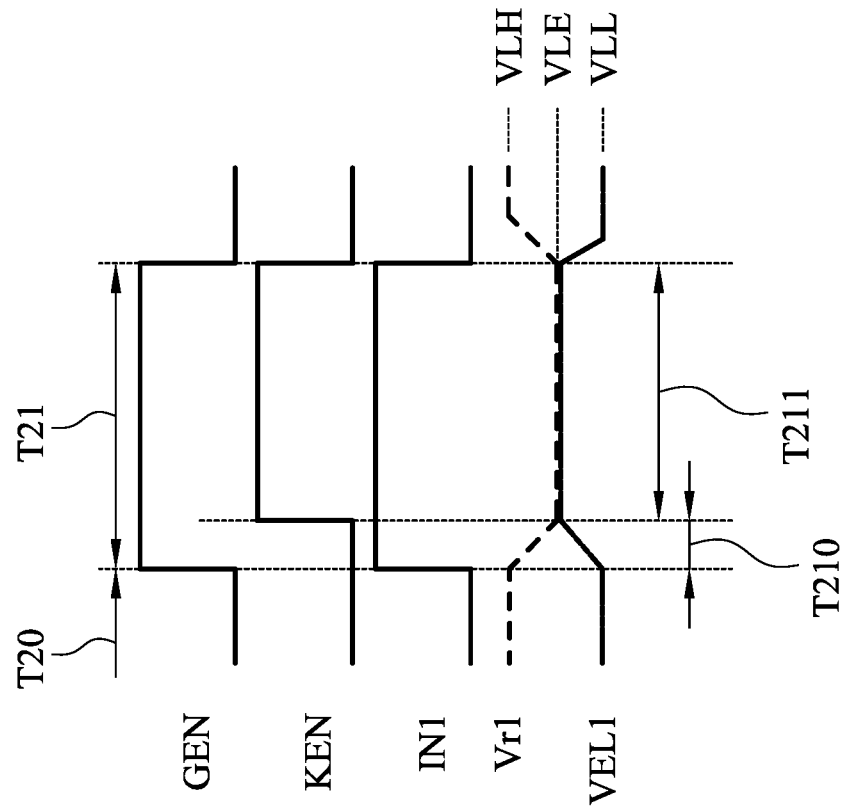
Fig. 2D
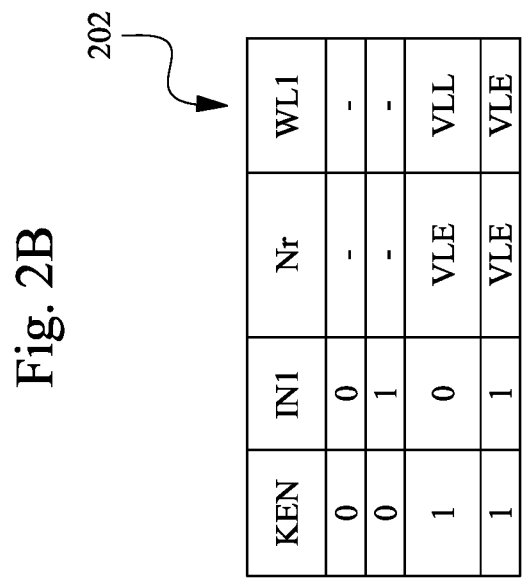
Fig. 2B
Fig. 2C

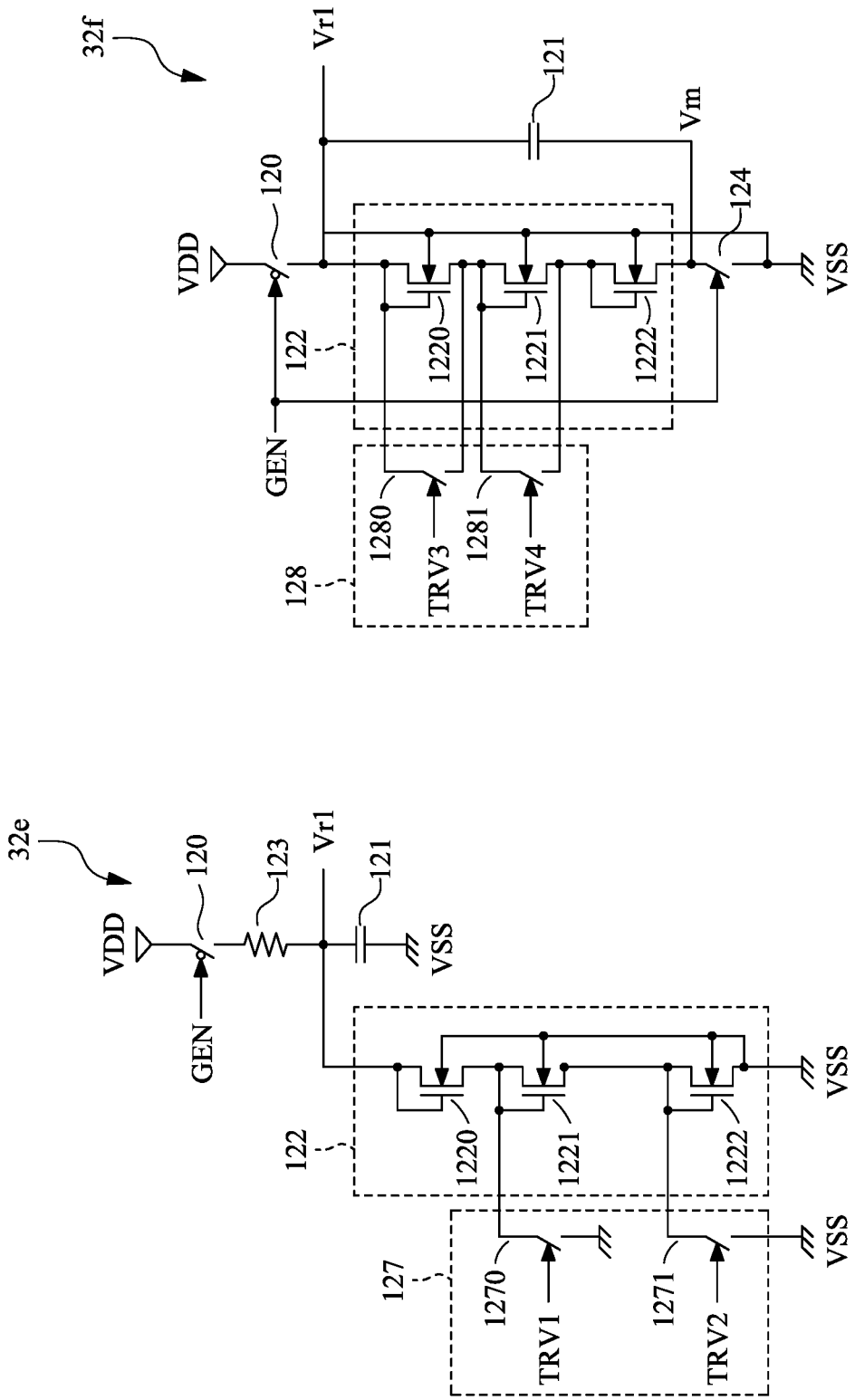

MEMORY DRIVER, MEMORY SYSTEM, AND OPERATING METHOD

CROSS-REFERENCE TO RELATED PATENT APPLICATIONS

This application claims priority to U.S. Provisional Application No. 63/366,466, filed on Jun. 15, 2022, entitled "Word Line Driver," and U.S. Provisional Application No. 63/380,947, filed on Oct. 26, 2022, entitled "Memory Driver, Memory System, And Operating Method," which all applications are hereby incorporated herein by reference in its entirety.

BACKGROUND

Memory devices have been used in various applications. Generally, the memory devices include, for example, static random access memory (SRAM) and dynamic random access memory (DRAM). A SRAM device is commonly used in high speed communication, image processing, and system-on-chip (SOC) applications.

While performing a read operation on an SRAM, an unacceptable phenomenon during a read operation is called a read disturb. The read disturb is a result of a change in a threshold voltage of transistors in the SRAM which in some instances causes the read operation to produce a value opposite to the actual stored value. In order to reduce the read disturb to an acceptable level, a word line of the SRAM memory is underdriven to a value below an operating voltage. This underdriving is called a read assist.

BRIEF DESCRIPTION OF THE DRAWINGS

Aspects of the present disclosure can be understood from the following detailed description and the accompanying figures. It is noted that, in accordance with the standard practice in the industry, various features are not drawn to scale. In fact, the dimensions of the various features may be arbitrarily increased or reduced for illustration or clarity of discussion.

FIG. 2B illustrates a table of how a reference circuit in FIG. 2A drives a reference node at the selected word line, in accordance with some embodiments.

FIG. 2C illustrates a table of how a bias circuit in FIG. 2A drives a reference node and a selected word line, in accordance with some embodiments.

FIG. 2D illustrates operating waveforms of the memory system in FIG. 2A, in accordance with some embodiments.

FIGS. 3A-3F illustrate reference circuits, in accordance with some embodiments.

DETAILED DESCRIPTION

Figure 1:
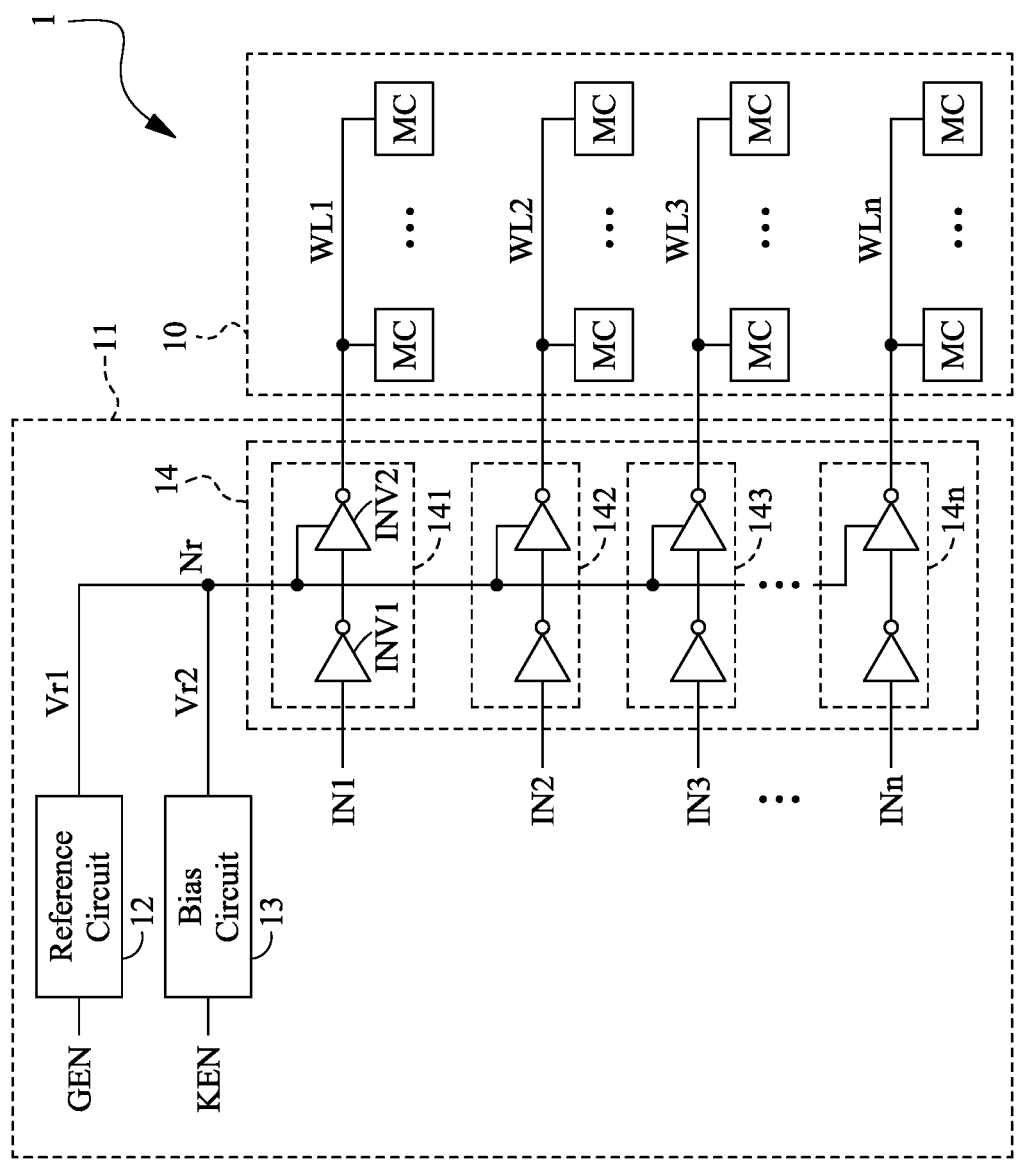
FIG. 1 illustrates a memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," "over," and the like, may be used herein for ease of description to describe one element or feature's relationship to another element(s) or feature(s), including those illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain zone(s) may refer to a source or a drain, individually or collectively dependent upon the context.

FIG. 1 illustrates a memory system 1, in accordance with some embodiments.

The memory system 1 includes a memory array 10 and a memory driver 11. The memory array 10 includes a plurality of memory cells MCs controlled by a plurality of word lines WL1-WLn. The memory driver 11 is coupled to the memory array 10 through the word lines WL1-WLn. The memory driver 11 is configured to control voltages on the word lines WL1-WLn according to input signals IN1-INn, so at least one of a write operation (also referred to as a program operation) or a read operation may be performed on the memory cells MCs coupled to a selected word line when the corresponding input signal is enabled (i.e., logic 1).

In at least one embodiment, the memory array 10 comprises the plurality of memory cells arranged in columns and rows. Each memory cell MC may be a static random access memory (SRAM) cell. An SRAM cell design, such as a 4 transistor design (4T) or a 6 transistor design (6T) or an 8 transistor design (8T) or other configurations with more transistors is designed to render the SRAM cell bi-stable, which means that the SRAM cell maintains its output at a binary state as long as adequate power is supplied to the SRAM. In general, an SRAM can operate at a higher speed than a DRAM, so computer cache memories tend to use SRAMs. Other SRAM applications may include embedded memories and networking equipment memories.

Each of the memory cells MCs is coupled to a corresponding one of the word lines and further controlled by the memory driver 11 via the corresponding word line. The word lines WL1-WLn are configured for transmitting addresses of memory cells MCs, to be read from and/or to be written to, or the like. The word lines WL1-WLn are sometimes referred to as "address lines." Each memory cell MC is controlled by the corresponding word line, so data can be read from or written to each of the memory cell MC when a voltage on the corresponding word line is controlled at an enabled voltage level. Although not illustrated, the memory array 10 further comprises at least one bit line. The at least one bit line is configured to transmit data to be written to and/or read from the memory cells MCs, indicated by the addresses on the corresponding word lines, or the like. The at least one bit line is sometimes referred to as a "data line." Various numbers of word lines and bit lines in the memory array 10 are within the scope of various embodiments.

In at least one embodiment, the memory driver 11 includes a reference circuit 12, a bias circuit 13, and a word line driver 14. The memory driver 11 is configured to receive input signals IN1-INn to respectively control voltages on the word lines WL1-WLn. Particularly, the reference circuit 12 is configured to selectively charge a capacitor by connecting the capacitor to an operating voltage terminal VDD (not shown in FIG. 1), according to an enable signal GEN, and provide a reference voltage Vr1 stored on the capacitor to a reference node Nr. When one of the input signals IN1-INn is selected and enabled, the reference voltage Vr1 at the reference node Nr is provided by the word line driver 14 to one of the corresponding word lines selected by the enabled input signal. Meanwhile, when the reference node Nr is coupled to the selected word line and the reference voltage Vr1 is provided to the selected word line, the reference circuit 12 is controlled by the enable signal GEN to disconnect the reference node Nr from the operating voltage terminal VDD, so the reference voltage Vr1 is provided by the capacitor and is lowered from a high voltage level to an enabled voltage level through charge sharing between the capacitor and an equivalent capacitance of the selected word line. More specifically, the enabled voltage level is lowered from the high voltage level at the operating voltage terminal VDD while remaining higher than a threshold voltage of an access transistor of the memory cell, enabling data transmissions with the memory cells MCs on the selected word line. As such, the enabled voltage level between the high voltage level of the operating voltage terminal VDD and the threshold voltage of the access transistor of the memory cell can be reached faster and maintained for a certain period of time, thereby improving data transmissions with the memory cells MCs on the selected word line. By driving the selected word line with the reference voltage Vr1 at the lower enabled voltage level instead of the high voltage level at the operating voltage terminal VDD, it is possible to achieve one or more advantages including, but not limited to, lower switching power, less read disturbances, or the like.

In at least one embodiment, the memory driver 11 includes buffers 141-14n respectively corresponding to the word lines WL1-WLn. Each of the buffers 141-14n includes inverters INV1, INV2 coupled in series to receive the corresponding input signal for controlling the voltage on the corresponding word line. For example, in the buffer 141, the inverters INV1, INV2 are connected in series to receive the input signal IN1 and accordingly control the voltage on the word line WL1. In the series connection of the inverters INV1, INV2, an output is generated by the inverter INV1 inverting the input signal IN1 and providing the inverted input signal IN1 to the inverter INV2. Since the inverter INV2 is supplied with the voltages at the reference node Nr and the ground voltage terminal VSS (not shown in FIG. 1), the inverter INV2 is configured as a word line driver to drive the word line WL1 by providing the voltage at reference node Nr or the voltage at the ground voltage terminal VSS to the word line according to the output from the inverter INV1.

In at least one embodiment, the reference circuit 12 is configured to selectively charge the capacitor by connecting to the operating voltage terminal VDD, according the enable signal GEN, and to supply the reference voltage Vr1 stored on the capacitor to the reference node Nr. Although not illustrated in FIG. 1 and is more fully described below with reference to FIG. 2A, the reference circuit 12 includes a capacitor coupled to the reference node Nr. The reference circuit 12 is controlled by the enable signal GEN and configured to charge the capacitor to the reference voltage Vr1 with the operating voltage terminal VDD when the enable signal GEN is disabled (i.e., logic 0). Further, when the reference voltage Vr1 is provided by the word line driver 14 from the reference node Nr to the selected word line, the reference circuit 12 is controlled by the enabled (i.e., logic 1) enable signal GEN to disconnect the reference node Nr from the operating voltage terminal VDD, and to enable the lowering of the reference voltage Vr1 from the high voltage level at the operating voltage terminal VDD to the enabled voltage level.

In at least one embodiment, the bias circuit 13 is also coupled to the reference node Nr. The bias circuit 13 is controlled by an enable signal KEN and configured to generate a reference voltage Vr2 at the enabled voltage level to the reference node Nr, so the voltage on the selected word line is regulated or maintained when the bias circuit 13 is enabled. In at least one embodiment, the reference voltage Vr2 generated by the bias circuit 13 is at the same enabled voltage level of the lowered reference voltage Vr1 generated by the reference circuit 12. For example, the bias circuit 13 may be a voltage divider implemented by passive or active resistors, so the reference voltage Vr2 may be biased and generated based at the enabled voltage level by the resistors.

Figure 2A:
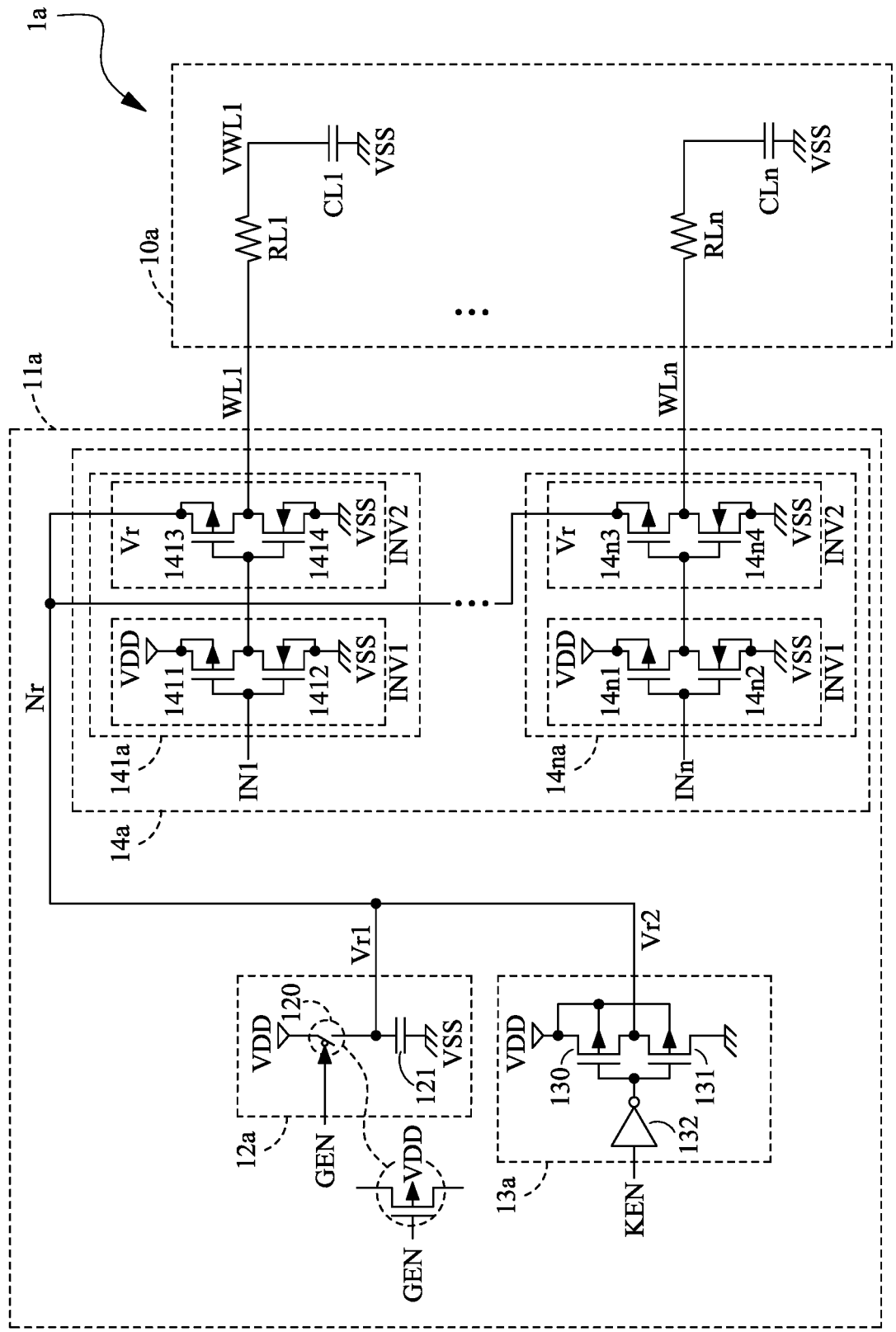
FIG. 2A illustrates a memory system, in accordance with some embodiment.

FIG. 2A illustrates a memory system 1a in accordance with some embodiment. The memory system 1a includes a memory array 10a and a memory driver 11a. The memory array 10a in FIG. 2A is similar to the memory array 10 in FIG. 1, while the memory cells MCs on each of the word lines WL1-WLn are not shown for clarity. Instead, equivalent circuits of each of the word lines WL1-WLn are depicted in FIG. 2A, showing that the memory cells MCs coupled to each word line can be represented as an equivalent resistor and an equivalent capacitance coupled in series to a ground voltage terminal VSS.

The memory driver 11a includes a reference circuit 12a, a bias circuit 13a, and a word line driver 14a. Each of the reference circuit 12a, the bias circuit 13a, and the word line driver 14a as depicted in FIG. 2A may be implemented in the memory driver 11, to replace each of the reference circuit 12, the bias circuit 13, and the word line driver 14 as depicted in FIG. 1. The reference circuit 12a is configured to selectively charge a capacitor by connecting the capacitor to an operating voltage terminal VDD, according to an enable signal GEN, and to supply a reference voltage Vr1 stored on the capacitor to the reference node Nr. Moreover, the word line driver 14a is controlled by the input signals IN1-INn to selectively couple the reference node Nr to a selected word line when the corresponding input signal is enabled (i.e., logic 1). Meanwhile, when the reference voltage Vr1 is provided from the reference node Nr to the selected word line, the reference node Nr is disconnected by the reference circuit 12a from the operating voltage terminal VDD to enable lowering the reference voltage Vr1 at the reference node Nr to an enabled voltage level, so the memory cells MCs coupled to the selected word line may be enabled for accessing data. Then, the bias circuit 13a may be enabled to provide a reference voltage Vr2 to the reference node Nr to regulate the voltage on selected word line at the enabled voltage level.

In at least one embodiment, each of the buffers 141a-14na includes inverters INV1, INV2 coupled in series to receive the corresponding input signal and accordingly control the voltage on the corresponding word line. For example, in the buffer 141a, the inverters INV1, INV2 are coupled in series to receive the input signal INV1. The inverter INV1 includes a PMOS 1411 and an NMOS 1412. The drains of the PMOS 1411 and the NMOS 1412 are respectively coupled to the operating voltage terminal VDD and the ground voltage terminal VSS. The gates of the PMOS 1411 and the NMOS 1412 are coupled together to receive the input signal IN1, while the sources of the PMOS 1411 and the NMOS 1412 are coupled together to generate an output by inverting the input signal INV1. Similarly, the inverter INV2 includes a PMOS 1413 and an NMOS 1414 forming an inverter to invert the output generated by the inverter INV1. However, the inverter INV2 is supplied by the voltages at the reference node Nr and the ground voltage terminal VSS. Thus, the inverter INV2 is configured as a word line driver to selectively provide to the corresponding word line the voltage at the reference node Nr or the voltage at the ground voltage terminal VSS at its output according to the inverted input signal INV1 generated by the inverter INV1. When the input signal IN1 is disabled (i.e., logic 0) and provided to the buffer 141a, the inverter INV2 selects the ground voltage terminal VSS to supply the word line WL1. On the other hand, when the input signal IN1 is enabled (i.e., logic 1), the INV2 couples the reference node Nr to the word line WL1, and thus provides the voltage at the reference node Nr to the word line WL1.

In at least one embodiment, the reference circuit 12a is configured to selectively charge the capacitor by connecting to the operating voltage terminal VDD, and to provide the reference node Nr to the reference voltage Vr1 stored on the capacitor. In some aspect, the reference circuit 12a is configured to control a connection between the reference node Nr and the operating voltage terminal VDD according to the enable signal GEN. The reference circuit 12a includes a switch 120 and a capacitor 121 coupled in series between the operating voltage terminal VDD and the ground voltage terminal VSS. The switch 120 is controlled by the enable signal GEN to selectively charge the capacitor 121 with the operating voltage terminal VDD. The reference voltage Vr1 is generated at a node between the switch 120 and the capacitor 121 and provided to the reference node Nr. When the enable signal GEN is disabled (i.e., logic 0), the switch 120 is controlled to be closed (conductive), so the operating voltage terminal VDD is coupled to a top plate of the capacitor 121. The reference voltage Vr1 at the high voltage level is accordingly outputted to the reference node Nr. When the enable signal GEN is enabled (i.e., logic 1), the switch 120 is opened (nonconductive), so the top plate of the capacitor 121 is disconnected from the operating voltage terminal VDD. The reference voltage Vr1 outputted to the reference node Nr is supplied by the voltage stored on the capacitor 121. Disconnecting the reference node Nr from the operating voltage terminal VDD renders the top plate of the capacitor 121 and the reference node Nr floating, and further enables the lowering of the reference voltage Vr1 through charge sharing between the capacitor 121 and the equivalent capacitor of the selected word line, e.g., equivalent capacitance CL1, when the reference node Nr is further coupled to the selected word line. In at least one embodiment, the switch 120 may be implemented using a PMOS as depicted on the left-hand side of FIG. 2A.

FIG. 2B illustrates a table 200 of how the reference circuit 12a in FIG. 2A drives the reference node Nr and the selected word line, in accordance with some embodiments.

Starting with the enable signal GEN being disabled (i.e., logic 0), the switch 120 of the reference circuit 12a is closed (conductive), so the top plate of the capacitor 121 receives the high voltage level VLH and the capacitor 121 is charged with the operating voltage VDD, so the reference voltage Vr1 at the high voltage level is outputted to the reference node Nr. Then, the word line driver 14a selects the reference voltage Vr1 having the high voltage level VLH or the ground voltage VSS at the low voltage level VLL to drive the word line WL1 according to the input signal IN1.

When the enable signal GEN and the input signal IN1 with respective logic 1 and 0 are provided, both the switch 120 of the reference circuit 12a and the PMOS 1413 are accordingly opened (nonconductive), causing the top plate of the capacitor 121 and the reference node Nr to be coupled together and floating. Provided that the capacitor 121 is charged with the operating voltage VDD, the reference voltage Vr1 outputted to the reference node Nr is maintained by the capacitor 121 at the high voltage level VLH. When the input signal IN1 is switched from logic 0 to logic 1, reference node Nr is coupled by the word line driver 14a to the word line WL1, causing the top plate of the capacitor 121 to be coupled to the word line WL1, so the charge stored on the capacitor 121 is shared and redistributed between the capacitor 121 and an equivalent capacitance CL1 of the word line WL1. As a result, the reference voltage Vr1 is lowered from the high voltage level VLH while the voltage VWL1 on the equivalent capacitance CL1 of the word line WL1 is raised from the low voltage level VLL through charge sharing. Subsequently, an enabled voltage level VLE is reached by both of the reference voltage Vr1 and the voltage VWL1 on the word line WL1. The enabled voltage level VLE generated by the reference circuit 12a may be represented as follows:

$$VLE = \frac{C121}{C121 + CL1} VLH,$$

where C121 and CL1 respectively denote capacitances of the capacitor 121 and the equivalent capacitance CL1 of the word line WL1. As can be observed from the equation above, a ratio of the enabled voltage level VLE to the voltage level VLH at the operating voltage terminal VDD is positively related to a ratio of the capacitance of the capacitor 121 to a sum of the capacitances of the capacitor 121 and the equivalent capacitance CL1 of the word line WL1. Therefore, the enabled voltage level VLE may be adjusted by properly selecting the capacitance of the capacitor 121. Other designs of the reference circuit 12a are also within the scope of various embodiments as long as the reference voltage Vr1 at the enabled voltage level VLE is generated through charge sharing.

In at least one embodiment, the bias circuit 13a is controlled by an enable signal KEN and configured to provide a reference voltage Vr2 at the enabled voltage VLE when the bias circuit 13a is enabled. More particularly, the bias circuit 13a may be a voltage divider to provide the reference voltage Vr2 at the same enabled voltage VLE of the reference voltage Vr1 when enabled. The bias circuit 13a includes PMOSs 130, 131 and an inverter 132. The PMOSs 130, 131 are coupled in series between the operating voltage terminal VDD and the ground voltage terminal VSS, while both gates of the PMOSs 130, 131 are coupled to receive an output provided by the inverter 132 by inverting the enable signal KEN. As a result, the reference voltage Vr2 at the enabled voltage level VLE is generated at a node coupled between the PMOSs 130, 131 when the enable signal KEN is enabled (i.e., logic 1). The enabled voltage level VLE is generated by dividing the high voltage level VLH at the operating voltage terminal VDD based on resistances of the PMOSs 130, 131. The enabled voltage level VLE generated by the bias circuit 13a may be represented as follows:

$$VLE = \frac{R131}{R130 + R131} VLH,$$

where R130, R131 respectively denote on resistances of the PMOSs 130, 131. Therefore, a ratio of the enabled voltage level VLE of the reference voltage level Vr2 to the high voltage level VLH at the operating voltage terminal VDD equals the on resistance of the PMOS 131 divided by a sum of the on resistances of the PMOSs 130, 131. By properly selecting the sizes of the PMOSs 130, 131, the enabled voltage level VLE of the reference voltage Vr2 may be biased at an adequate voltage level to control the memory cells MCs to be accessible, allowing data transmission with the memory cells MCs coupled on the word line WL1. Other designs of the bias circuit 13a are also within the scope of various embodiments as long as the reference voltage Vr2 at the enabled voltage level VLE is generated through voltage division when enabled.

FIG. 2C illustrates a table 202 of how the bias circuit 13a in FIG. 2A drives the reference node Nr and the selected word line, in accordance with some embodiments.

When the enable signal KEN is disabled (i.e., logic 0), both the PMOSs 130, 131 are turned off, and the bias circuit 13a is disabled without generating the reference voltage Vr2. As such, the voltage at the reference node Nr is supplied by the capacitor 121 of the reference circuit 12a rather than the bias circuit 13a. When the enable signal KEN is enabled (i.e., logic 1), both the PMOSs 130, 131 are turned on, so the reference voltage Vr2 is biased by the PMOSs 130, 131 at the enabled voltage level VLE and provided to the reference node Nr. Then, the word line driver 14a selectively couples the reference node Nr or the ground voltage terminal VSS to the word line WL1 according to the input signal IN1.

FIG. 2D illustrates operating waveforms of the memory system 1a in FIG. 2A, in accordance with some embodiments.

In a time period T20, when both of the enable signals GEN, KEN are at logic 0, the voltage at the reference node Nr is driven by the reference circuit 12a while the bias circuit 13a is disabled. More particularly, the reference node Nr is coupled to the operating voltage terminal VDD and provided with the reference voltage Vr1 at the high voltage level VLH stored on the capacitor 121.

In a time period T210 after the input signal IN1 and the enable signal GEN are raised to logic 1, the capacitor 121 is disconnected from the operating voltage terminal VDD and the word line WL1 is coupled to the reference node Nr by the word line driver 14a, causing the charge stored on the capacitor 121 to be redistributed between the capacitor 121 and the equivalent capacitance CL1 of the word line based on their capacitances. During the charge sharing or the charge redistribution phase, the reference voltage Vr1 at the reference node Nr is lowered from the high voltage level VLH, and the voltage VWL1 on the word line WL1 is raised from a low voltage level VLL. When the charge sharing or the charge redistribution phase ends at an end of the time period T210, the enabled voltage level VLE is reached by both of the reference voltage Vr at the reference node Nr and the voltage VWL1 on the word line WL1, so the memory cells MCs coupled on the word line WL1 are controlled by the enabled voltage level LVE to be accessible. Although not explicitly illustrated, a rising edge of the enable signal GEN precedes a rising edge of the input signal IN1 within the time period T210, so the disconnection of the capacitor 121 and the reference node Nr from the operating voltage terminal VDD occurs earlier than the coupling of the reference node Nr to the selected word line WL1, which ensures the reference voltage Vr1 stored on the capacitor 121 can be secured without leakage.

In a time period T211 after the time period T210, the enable signal KEN is switched from logic 0 to logic 1, enabling the bias circuit 13a to provide the reference voltage Vr2 to the reference node Nr. More particularly, the reference voltage Vr2 generated by the bias circuit 13a is at the enabled voltage level VLE which is the same as the enabled voltage level VLE of the reference voltage Vr1. Therefore, after the enabled voltage level VLE is reached by the voltage VWL1, the bias circuit 13a may be enabled to provide the reference voltage Vr2 at the same enabled voltage level VLE of the reference voltage Vr1, so the voltage VWL1 on the word line WL1 may be regulated or stabilized.

In at least one embodiment, the memory system 1a is configured to utilize the reference circuit 12a for generating the reference voltage Vr1 and providing the reference voltage Vr1 to the reference node Nr. Further, the reference voltage Vr1 is lowered to the enabled voltage level VLE through charge sharing. After the reference voltage Vr1 is provided to the selected word line and lowered to the enabled voltage level VLE, the bias circuit 13a is enabled to provide the reference voltage Vr2 at the same enabled voltage level VLE through voltage division. Under such a circumstance, it is possible to achieve one or more advantages including, but not limited to, higher operating speed and lower power consumption through charge sharing, and also reduced noise on the reference node Nr through voltage division.

Figure 3B:
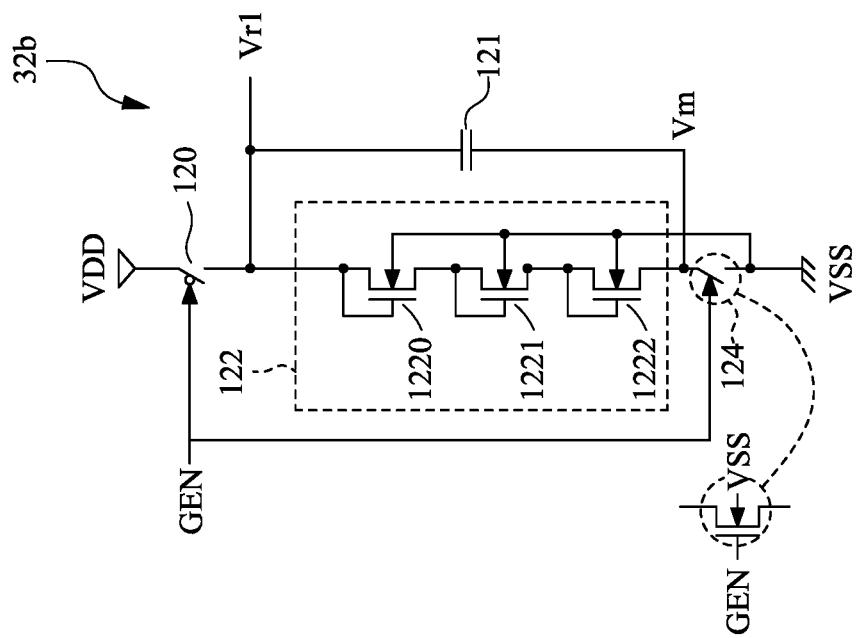
Figure 3A:
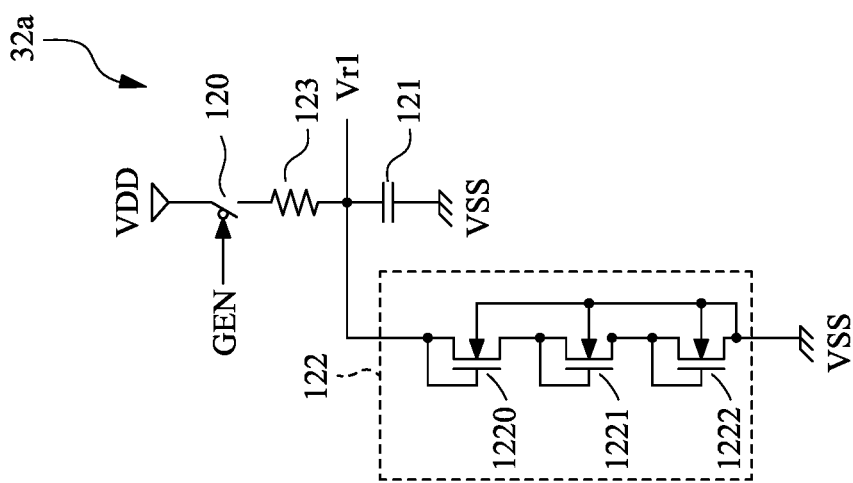

FIG. 3A illustrates a reference circuit 32a, in accordance with some embodiments. The reference circuit 32a in FIG. 3A is similar to the reference circuit 12a in FIG. 2A except that the reference circuit 32a further includes a bias string 122 and a resistor 123. The reference circuit 32a may be utilized in the memory system 1a to replace the reference circuit 12a. As used herein, a bias string is an element having a fixed or controllable voltage across it, so the bias string is configured to selectively limit the voltage at the reference node Nr.

In at least one embodiment, the bias string 122 is coupled in parallel to the capacitor 121. More particularly, the bias string 122 is coupled to both ends of the capacitor 121 and includes NMOSs 1220-1222. Each of the NMOSs 1220-1222 is diode-connected, i.e., the drain and gate of each NMOS are coupled together. Further, the diode-connected NMOSs 1220-1222 are coupled in series between both ends of the capacitor 121. In addition, the resistor 123 is coupled between the switch 120 and the capacitor 121 for limiting a current flowing through the bias string 122. The reference voltage Vr1 is generated at a node between the resistor 123 and the capacitor 121.

In at least one embodiment, when the switch 120 is closed (conductive) by the enable signal GEN, the capacitor 121 is charged to the operating voltage by connection to the terminal VDD through the switch 120 and the resistor 123. However, a voltage across each diode-connected NMOS is limited to be less than or equal to a threshold voltage of each NMOS. When the reference voltage Vr1 of the capacitor 121 is charged to be greater than or equal to a sum of the threshold voltages of the NMOSs 1220-1222, the NMOSs 1220-1222 are turned on (conductive) and a current path is created by the bias string 122 to discharge capacitor 121 through its top plate. As a result, the reference voltage Vr1 is limited by the bias string 122 to be no greater than the sum of threshold voltages of the NMOSs 1220-1222. Assuming the threshold voltage of each NMOS 1220-1222 equals Vthn, when the switch 120 is closed and the capacitor 121 is charged by the operating voltage terminal VDD, the reference voltage Vr1 is limited by the bias string 122 at the voltage level of 3*Vthn and stored on the capacitor 121. It should be understood that different structures of the bias string 122, such as different numbers of the diode-connected MOSs in the bias string or other suitable semiconductor device adaptable for use in the bias string, are also within the scope of various embodiments.

Further, when the enable signal GEN and one of the input signals INx are logic 1, the reference node Nr is disconnected from the operating voltage terminal VDD and coupled to the selected word line, so the charge stored by the capacitor 121 is shared with the equivalent capacitance on the selected word line, the enabled voltage level VLE is adjusted and represented as follows:

$$VLE = \frac{C121}{C121 + CL1} \times 3 \times Vthn - Vdrop.$$

Particularly, since the voltage level at the top plate of the capacitor 121 is limited by the bias string 122 at 3*Vthn rather than the high voltage level VLH, the enabled voltage level VLE resulting from redistributing the charge stored by the capacitor 121 is accordingly adjusted by the bias string 122. By limiting the reference voltage Vr1 with the bias string 122, it is possible to achieve one or more advantages including, but not limited to lower variations from the operating voltage terminal VDD.

FIG. 3B illustrates a reference circuit 32b, in accordance with some embodiments. The reference circuit 32b in FIG. 3B is similar to the reference circuit 32a in FIG. 3A except that the reference circuit 32b further includes a switch 124 coupled at one end to the capacitor 121 and the bias string 122 and at the other end to the ground voltage terminal VSS. Similar to the reference circuit 32a, the reference circuit 32b may also be utilized in the memory system 1a depicted in FIG. 2A to replace the reference circuit 12a.

In at least one embodiment, the capacitor 121 and the bias string 122 are coupled in parallel between the switches 120 and 124. The switch 124 is controlled by the enable signal GEN to be opened (nonconductive) when the enable signal GEN is disabled (i.e., logic 0), and closed (conductive) when the enable signal GEN is enabled (i.e., logic 1). For example, the switch 124 is implemented by a single NMOS with its gate coupled to receive the enable signal GEN.

As such, when the enable signal GEN is disabled (i.e., logic 0), the switches 120 and 124 are respectively closed and opened. The capacitor 121 is charged by the high voltage level VLH at the operating voltage terminal VDD. On the other hand, since the voltage across the capacitor 121 is limited by the bias string 122 to be at the level of 3*Vthn, the bottom plate of the capacitor 121 is also charged by connection to the operating voltage terminal VDD to a voltage level of VLH-3*Vthn through the bias string 122. When the enable signal GEN is enabled (i.e., logic 1), the switches 120 and 124 are respectively opened and closed, causing the top plate of the capacitor 121 floating and the bottom plate of the capacitor 121 to be coupled to the ground voltage terminal VSS. Since the floating top plate of the capacitor 121 maintains the voltage across the capacitor 121 at the level of 3*Vthn, after the bottom plate of the capacitor 121 is pulled to the low voltage level VLL by the ground voltage terminal VSS, the top plate of the capacitor 121 is correspondingly pulled down to the voltage level of 3*Vthn. Therefore, the reference circuit 32b is capable of outputting the reference voltage Vr1 at the voltage level of 3*Vthn limited by the bias string 122.

Figure 3D:
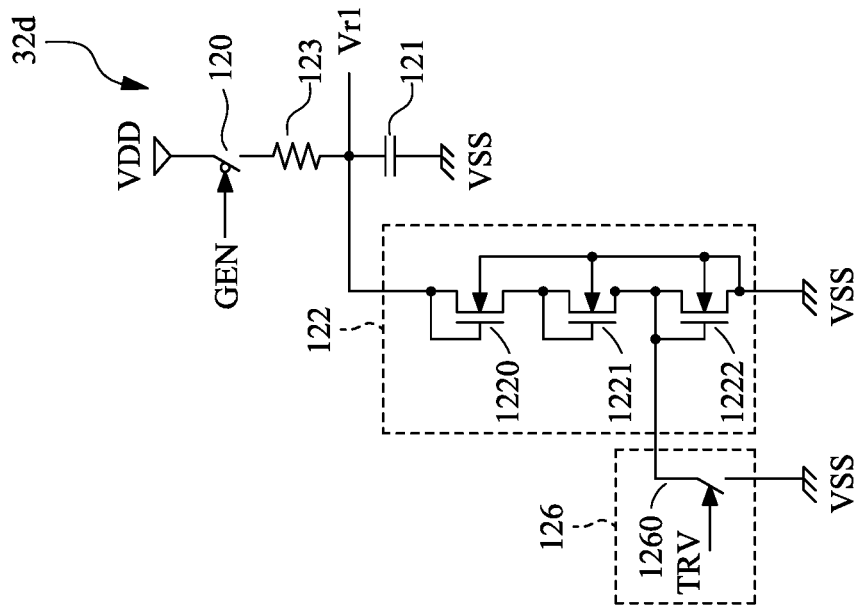
Figure 3C:
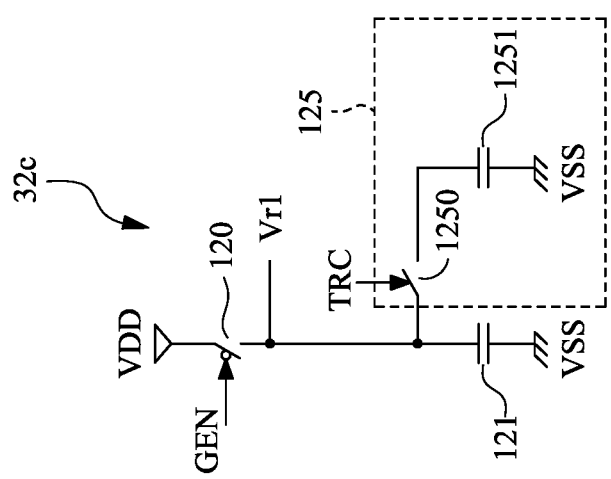

FIG. 3C illustrates a reference circuit 32c, in accordance with some embodiments. The reference circuit 32c in FIG. 3C is similar to the reference circuit 12a in FIG. 2A except that the reference circuit 32c further includes a capacitor trimming circuit 125 coupled in parallel to the capacitor 121. The reference circuit 32c may replace the reference circuit 12a and be utilized in the memory system 1a in FIG. 2A.

The capacitor trimming circuit 125 includes a switch 1250 coupled in series with a capacitor 1251. The series combination of the switch 1250 and the capacitor 1251 is coupled between both ends of, i.e., in parallel with, the capacitor 121. The switch 1250 is controlled by a trimming signal TRC. When the switch 1250 is closed (conductive), the capacitor 1251 is coupled to the capacitor 1250. Therefore, when the capacitor trimming circuit 125 is enabled and the capacitor 1251 is coupled to the capacitor 1250, an equivalent capacitance of the reference circuit 32c is increased to further adjust the enabled voltage level VLE of the reference voltage Vr1. Accordingly, offsets to the enabled voltage level VLE of the reference voltage Vr1 caused by process variations may be adjusted and calibrated by the capacitor trimming circuit 125.

FIG. 3D illustrates a reference circuit 32d, in accordance with some embodiments. The reference circuit 32d in FIG. 3D is similar to the reference circuit 32a in FIG. 3A except that the reference circuit 32d further includes a bias trimming circuit 126 coupled to the bias string 122. Similarly, the reference circuit 32d may replace the reference circuit 12a and be utilized in the memory system 1a in FIG. 2A.

The bias trimming circuit 126 includes a switch 1260 coupled to the bias string 122. Particularly, the switch 1260 is coupled between the drain of the NMOS 1222 and the ground voltage terminal VSS, and controlled by a trimming signal TRV. When the switch 1260 is closed (conductive), NMOS 1222 is bypassed, so that a total number of NMOSs functioning in the bias string 122 is trimmed to 2 by the bias trimming circuit 126. Correspondingly, when the switch 120 is turned on (conductive), the voltage across the capacitor 121 is limited at a voltage level 2*Vthn, since one of the NMOSs 1220-1222 in the bias string 122 is bypassed. In other words, the high voltage level VLH charged on the capacitor 121 is adjusted by the bias trimming circuit 126 from 3*Vthn to 2*Vthn, and further adjusts the enabled voltage level VLE.

FIG. 3E illustrates a reference circuit 32e, in accordance with some embodiments. The reference circuit 32e in FIG. 3E is similar to the reference circuit 32a in FIG. 3A except that the reference circuit 32e further includes a bias trimming circuit 127 coupled to the bias string 122. Similarly, the reference circuit 32e may replace the reference circuit 12a and be utilized in the memory system 1a in FIG. 2A.

In at least one embodiment, the bias trimming circuit 127 includes multiple switches 1270 and 1271. The switch 1270 is coupled between the drain of the NMOS 1221 and the ground voltage terminal VSS, and the switch 1271 is coupled between the drain of the NMOS 1222 and the ground voltage terminal VSS. The switches 1270 and 1271 are respectively controlled by the trimming signals TRV1, TRV2. Therefore, when the switch 1271 is closed (conductive) by the trimming signal TRV2, the NMOS 1222 is bypassed, and the total number of NMOSs in the bias string 122 is adjusted to 2. Further, when the switch 1270 is closed (conductive) by the trimming signal TRV1, the NMOSs 1221 and 1222 are both bypassed, and the total number of NMOSs in the bias string 122 is adjusted to 1. Therefore, by deploying multiple switches 1270, 1271 coupled to the drains of different NMOSs in the bias string 122, different total numbers of NMOSs in the bias string can be achieved.

FIG. 3F illustrates a reference circuit 32f, in accordance with some embodiments. The reference circuit 32f in FIG. 3F is similar to the reference circuit 32b in FIG. 3B except that the reference circuit 32f further includes a bias trimming circuit 128 coupled to the bias string 122. Similarly, the reference circuit 32f may replace the reference circuit 12a and be utilized in the memory system 1a in FIG. 2A.

In at least one embodiment, the bias trimming circuit 128 includes multiple switches 1280 and 1281. The switch 1280 is coupled in parallel to the NMOS 1120, and the switch 1281 is coupled in parallel to the NMOS 1221. The switches 1280 and 1281 are respectively controlled by the trimming signals TRV3, TRV4. More particularly, the switches 1280 and 1281 are respectively for bypassing the NMOSs 1220 and 1221. When one of the switches 1280 and 1281 is closed (conductive), the total number of NMOSs in the bias string 122 is adjusted to 2. When both of the switches 1280 and 1281 are closed (conductive), the total number of NMOSs in the bias string 122 is adjusted to 1. Therefore, by deploying multiple switches 1280, 1281 coupled to different NMOSs in the bias string 122, different total numbers of NMOSs in the bias string can be achieved.

Figure 4C:
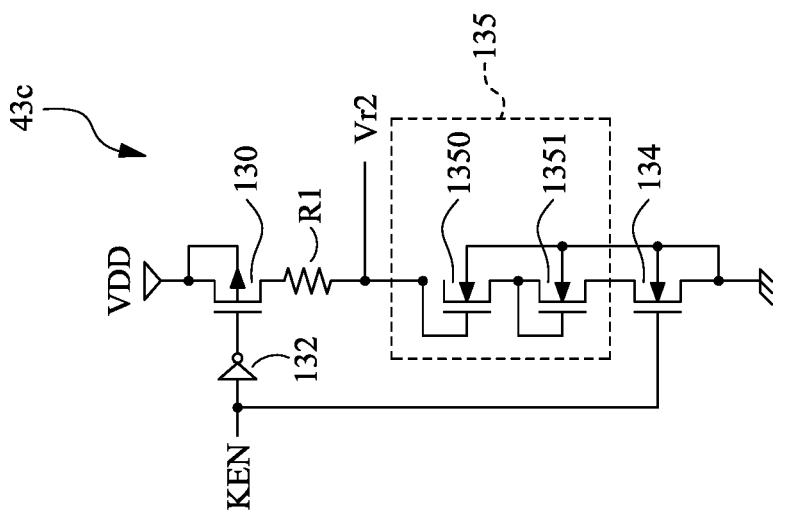
FIGS. 4A-4G illustrate bias circuits, in accordance with some embodiments.
Figure 4B:
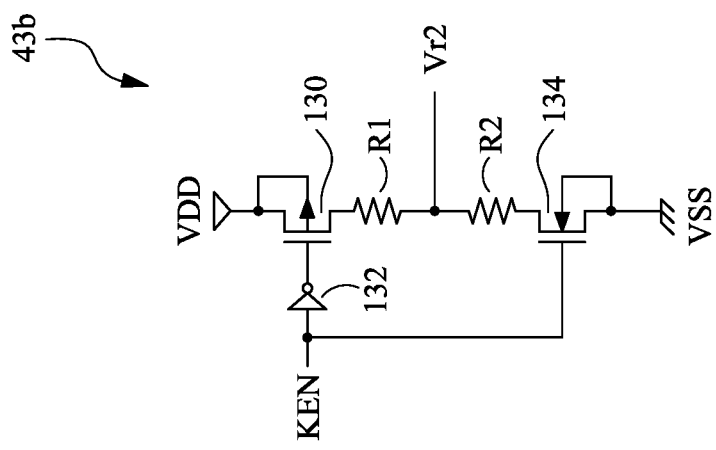
Figure 4A:
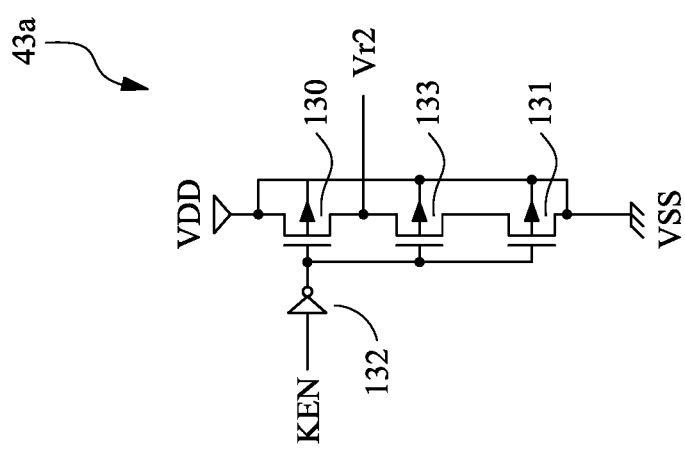

FIG. 4A illustrates a bias circuit 43a, in accordance with some embodiments. The bias circuit 43a in FIG. 4A is similar to the bias circuit 13a in FIG. 2A except that the bias circuit 43a further includes a PMOS 133. The bias circuit 43a may replace the bias circuit 13a and be utilized in the memory system 1a in FIG. 2A.

The PMOS 133 is coupled between the PMOSs 130 and 131, and the reference voltage Vr2 is generated at a node between the PMOSs 130 and 133. More particularly, when the bias circuit 43a is enabled by the enable signal KEN, the enabled voltage level VLE generated by the bias circuit 13a may be represented as follows:

$$VLE = \frac{R131 + R133}{R130 + R131 + R133} VLH,$$

where R130, R131, R133 respectively denote on resistances of the PMOSs 130, 131, 133. By coupling the PMOS 131, 133, variations to the enabled voltage level caused by process nonidealities may be averaged and reduced, thereby improving stability of the bias circuit 43a.

FIG. 4B illustrates a bias circuit 43b, in accordance with some embodiments. The bias circuit 43b in FIG. 4B is similar to the bias circuit 13a in FIG. 2A except that the bias circuit 43b further includes resistors R1, R2, and the PMOS 131 in FIG. 2A is replaced by the NMOS 134 in FIG. 4B. The bias circuit 43a may replace the bias circuit 13a and be utilized in the memory system 1a in FIG. 2A.

The resistors R1, R2 are coupled in series between the drain of the PMOS 130 and the drain of the NMOS 134. The reference voltage Vr2 is generated at a node between the resistors R1, R2. More particularly, the resistances of R1, R2 is much larger than the on resistances of the PMOS 130 and the NMOS 134. Thus, when the bias circuit 43a is enabled by the enable signal KEN, the enabled voltage level VLE generated by the bias circuit 13a may be represented as follows:

$$VLE = \frac{R2}{R1 + R2} VLH.$$

Since the resistances of the resistor R1, R2 are much greater than the on resistances of the PMOS 130 and the NMOS 134, the enabled voltage level VLE is dominated by the resistors, and the on-resistances of the PMOS 130 and the NMOS 134 in the above equation are neglected. Thus, the bias circuit 43b may generate the reference voltage Vr2 at the enabled voltage level VLE by voltage division of the high voltage level VLH at the operating voltage terminal VDD through the resistors R1, R2.

FIG. 4C illustrates a bias circuit 43c, in accordance with some embodiments. The bias circuit 43c in FIG. 4C is similar to the bias circuit 43b in FIG. 4B except that the resistor R2 in FIG. 4B is replaced by a bias string 135. Similarly, the bias circuit 43c may replace the bias circuit 13a and be utilized in the memory system 1a in FIG. 2A.

The bias string 135 is coupled between the resistance R1 and the drain of the NMOS 134. The bias string 135 comprises NMOSs 1350, 1351 coupled in series between the resistor R1 and the NMOS 134. More particularly, each of the NMOSs 1350, 1351 is diode-connected, meaning that each drain is coupled to each gate for each of the NMOSs 1350, 1351. When the bias circuit 43c is enabled by the enable signal KEN, the bias string 135 is turned on by the high voltage level at the operating voltage terminal VDD. Since the voltage across each of the diode-connected NMOSs 1350, 1351 is limited to Vthn, the reference voltage Vr2 generated by the bias circuit 43c is limited at the enabled voltage level VLE of 2*Vthn as there are two diode-connected NMOSs 1350, 1351 in the bias string 135.

Figure 4E:
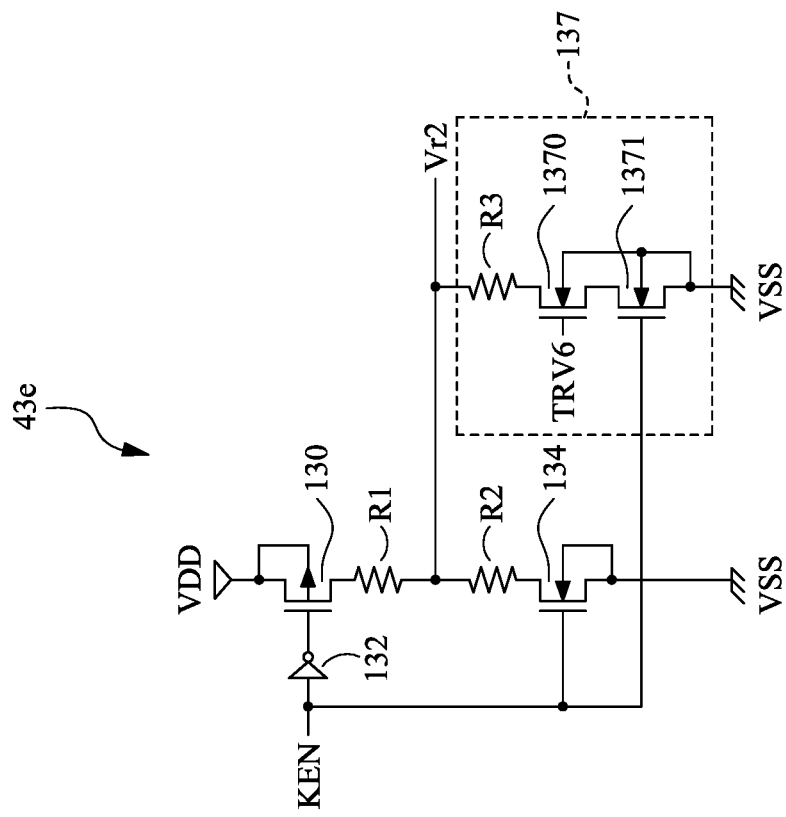
Figure 4D:
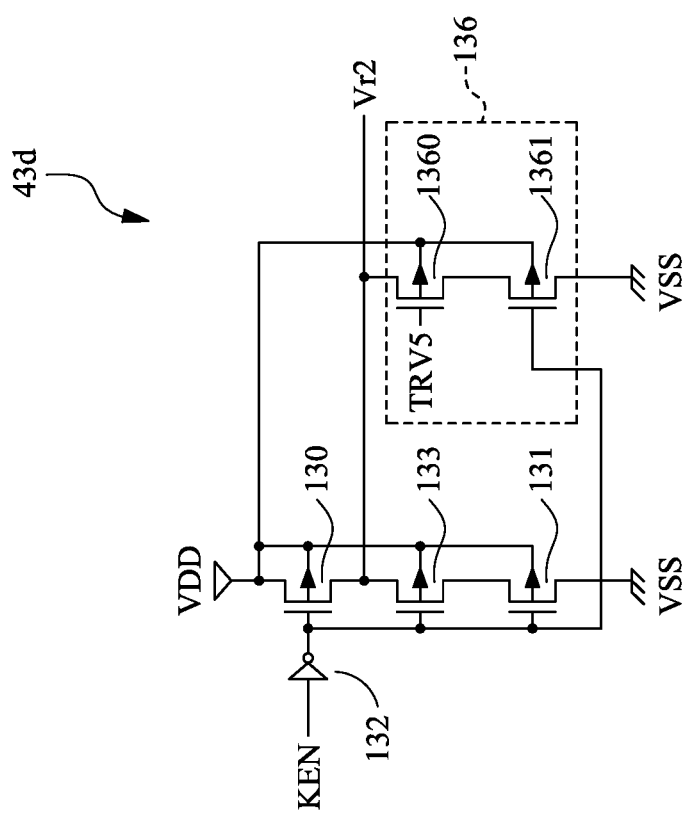

FIG. 4D illustrates a bias circuit 43d, in accordance with some embodiments. The bias circuit 43d in FIG. 4D is similar to the bias circuit 43a in FIG. 4A except that the bias circuit 43d further comprises a trimming circuit 136 coupled in parallel to the PMOSs 131, 133. Similarly, the bias circuit 43d may replace the bias circuit 13a and be utilized in the memory system 1a in FIG. 2A.

Particularly, the trimming circuit 136 includes PMOSs 1360, 1361 coupled in series between the source of PMOS 133 and the ground voltage terminal VSS. The PMOSs 1360, 1361 are respectively controlled by a trimming signal TRV5 and the enable signal KEN. When the bias circuit 43d is enabled by the enable signal KEN and the PMOS 1360 is turned on (conductive) by the trimming signal TRV5, the enabled voltage level VLE of the reference voltage Vr2 generated by the bias circuit 43d may be represented as follows:

$$VLE = \frac{(R131 + R133)//(R1360 + R1361)}{R130 + (R131 + R133)//(R1360 + R1361)} VLH,$$

where R130, R131, R1361 respectively denote on resistances of the PMOSs 130, 131, 1361. Particularly, when PMOS 1360 is enabled by the trimming signal TRV5, the PMOS 1361 is coupled in parallel to the PMOS 131, so a pull-down resistance is adjusted from R131+R133 to (R131+R133)//(R1360+R1361). Therefore, the enabled voltage level VLE of the reference voltage Vr2 generated by the bias circuit 43d may be adjusted by the trimming circuit 136.

FIG. 4E illustrates a bias circuit 43e, in accordance with some embodiments. The bias circuit 43e in FIG. 4E is similar to the bias circuit 43b in FIG. 4B except that the bias circuit 43e further includes a trimming circuit 137 coupled in parallel to the resistor R2 and the NMOS 134. Similarly, the bias circuit 43e may replace the bias circuit 13a and be utilized in the memory system 1a in FIG. 2A.

The trimming circuit 137 includes a resistor R3 and NMOSs 1370, 1370 coupled in series between the resistor R1 and the ground voltage terminal VSS. The NMOSs 1370, 1371 are respectively controlled by a trimming signal TRV6 and the enable signal KEN. When both of the trimming signal TRV6 and the enable signal KEN are enabled, the enabled voltage level VLE of the reference voltage Vr2 generated by the bias circuit 43d may be represented as follows:

$$VLE = \frac{R2//R3}{R1 + R2//R3} VLH.$$

Since the resistances of the resistor R1, R2, R3 are much greater than the on resistances of the PMOS 130 and the NMOSO 134, the enabled voltage level VLE is dominated by the resistors, and the on-resistances of the PMOS 130 and the NMOS 134 in the equation above can be neglected. Thus, the bias circuit 43e may generate the reference voltage Vr2 at the enabled voltage level VLE adjusted by the trimming circuit 137.

Figure 4G:
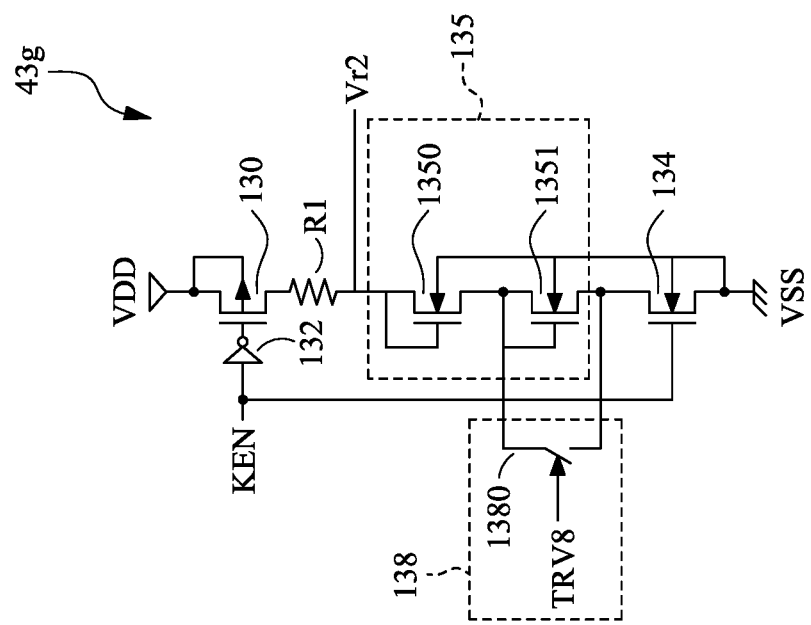
Figure 4F:
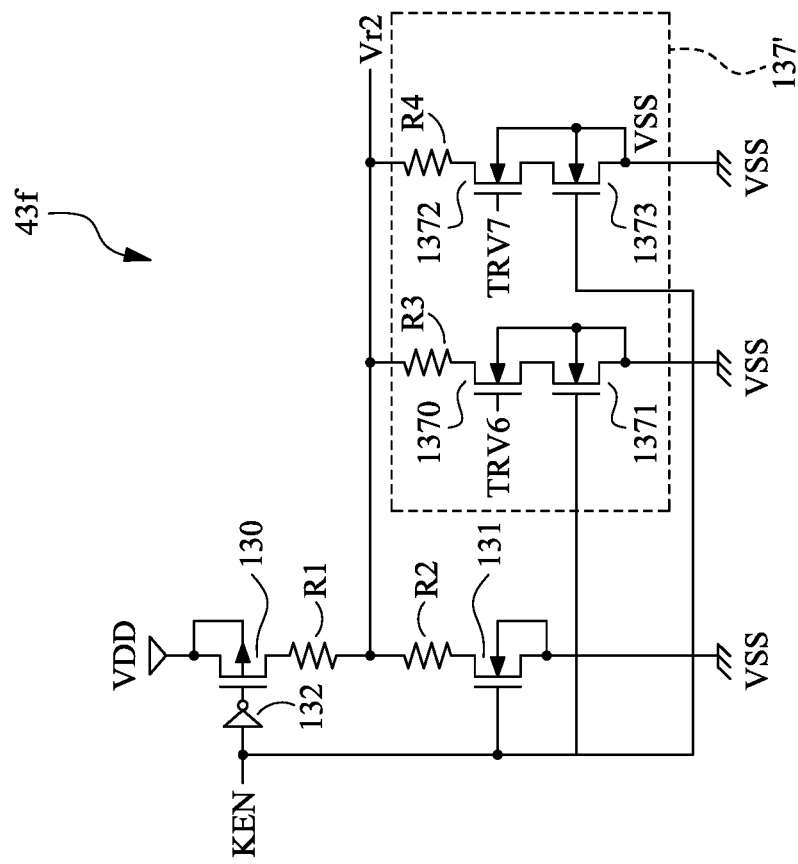

FIG. 4F illustrates a bias circuit 43f, in accordance with some embodiments. The bias circuit 43f in FIG. 4E is similar to the bias circuit 43e in FIG. 4E except that the trimming circuit 137 in FIG. 4E is replaced by a trimming circuit 137' in FIG. 4F. Similarly, the bias circuit 43f may be utilized in the memory system 1a in FIG. 2A to replace the bias circuit 13a.

The trimming circuit 137' is coupled in parallel to the resistor R2 and the NMOS 134. In addition to the resistor R3 and the NMOSs 1370, 1371 included in the trimming circuit 137, the trimming circuit 137' further includes a resistor R4 and NMOSs 1372, 1373. More particularly, the R4 and the NMOSs 1372, 1373 are coupled in series between the resistor R1 and the ground voltage terminal VSS. The NMOSs 1372, 1373 are respectively controlled by a trimming signal TRV7 and the enable signal KEN. In other words, the trimming circuit 137' provide another resistor R4 coupled in parallel for adjusting the enabled voltage level VLE of the reference voltage Vr2. Therefore, the bias circuit 43 may generate the reference voltage Vr2 at different enabled voltage levels VLE by adjusting the resistance coupled to the resistor R2 in the trimming circuit 137'.

FIG. 4G illustrates a bias circuit 43g, in accordance with some embodiments. The bias circuit 43g in FIG. 4G is similar to the bias circuit 43c in FIG. 4E except that the bias circuit 43g further includes a trimming circuit 138 coupled to the bias string 135. Similarly, the bias circuit 43g may be utilized in the memory system 1a in FIG. 2A to replace the bias circuit 13a.

The trimming circuit 138 is coupled in parallel to the NMOS 1351 of the bias string 135. The trimming circuit 138 includes a switch 1380 coupled between the drain and source of the NMOS 1351. The switch 1380 is controlled by a trimming signal TRV8. When the switch 1380 is opened (nonconductive), a total number of NMOSs in the bias string 135 is 2. However, when the switch 1380 is closed (conductive), the total number of NMOSs in the bias string 135 is adjusted to 1. Therefore, the bias circuit 43g adjusts the total number of NMOSs functioning in the bias string 135 by the trimming circuit 135's control, and further adjusts the enabled voltage level VLE of the reference voltage Vr2.

Figure 5A:
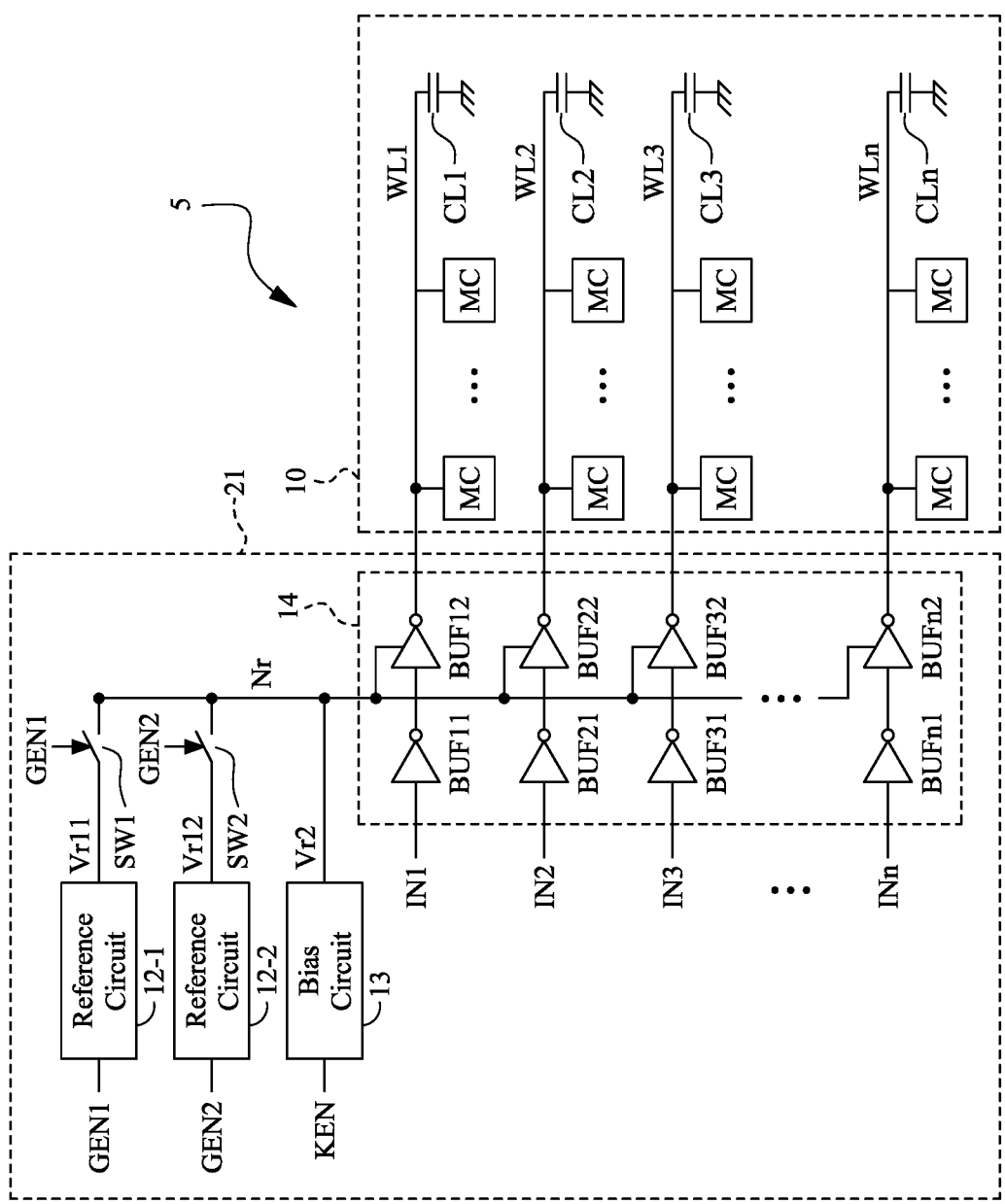
FIG. 5A illustrates a memory system, in accordance with some embodiments.

FIG. 5A illustrates a memory system 5, in accordance with some embodiments. The memory system 5 includes a memory array 10 and a memory driver 21. The memory driver 21 includes reference circuits 12-1, 12-2, a bias circuit 13, and a word line driver 14. Details regarding the memory array 10, the reference circuit 12-1, 12-2, the bias circuit 13, and the word line driver 14 in FIG. 5A are substantially the same as described above for the memory array 10, the reference circuit 12, the bias circuit 13, and the word line driver 14 with reference to FIG. 1, as well as the reference circuit 12a, the bias circuit 13a, and the word line driver 14a with reference to FIG. 2A, and are not repeated herein.

More particularly, the memory driver 21 includes two reference circuits 12-1, 12-2 rather than only one reference circuit 12 as depicted in FIG. 1. Each of the reference circuits 12-1, 12-2 is similar to the reference circuit 12 in FIG. 1. The reference circuits 12-1, 12-2 and the bias circuit 13 are coupled to the reference node Nr. The reference circuits 12-1, 12-2 are respectively controlled by enable signals GEN1, GEN2 and coupled to the reference node Nr respectively through the switches SW1, SW2. Although not illustrated, the reference circuits 12-1, 12-2 each include a capacitor and are configured to selectively charge each capacitor according to the corresponding enable signals GEN1, GEN2. The reference voltages Vr11, Vr12 respectively stored on the capacitors are provided to the reference node Nr through the switches SW1, SW2 controlled by the enable signals GEN1, GEN2. Moreover, when one of the reference voltages Vr11, Vr12 is provided to drive a selected word line, the reference voltages Vr11 or Vr12 is lowered to the enabled voltage level VLE through charge sharing. Details regarding charge sharing are described above in relation to FIGS. 2A, 2B and are not repeated here.

Figure 5B:
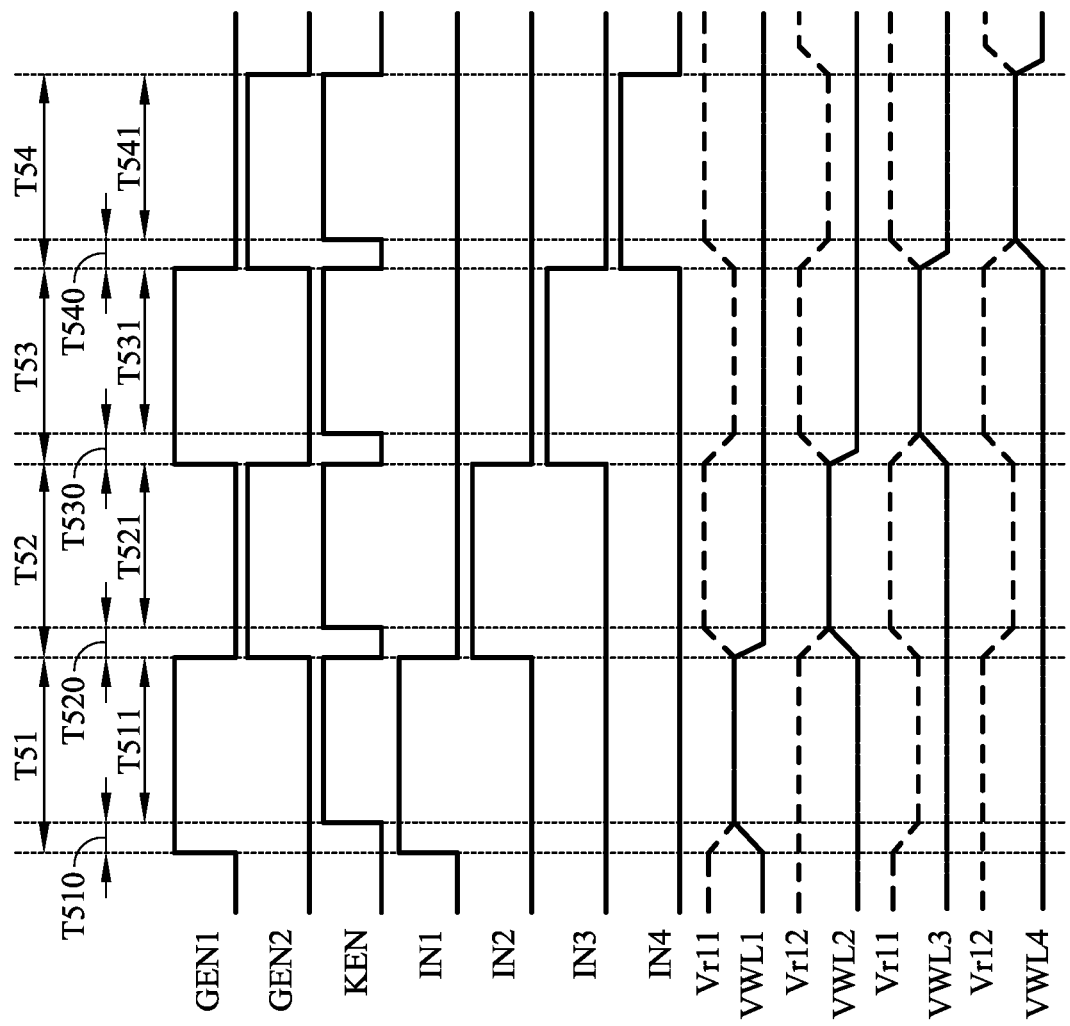
FIG. 5B illustrates operating waveforms of the memory system in FIG. 5A, in accordance with some embodiments.

FIG. 5B illustrates operating waveforms of the memory system 5 in FIG. 5A, in accordance with some embodiments.

The operating waveforms are divided by the states of the enable signals GEN1, GEN2 into time periods T51-T54. Each of the time periods T51-T54 is for driving different ones of the word lines WL1-WL4. For example, the input signals IN1-IN4 are respectively enabled in the time periods T51-T54, and thus the word lines WL1-WL4 are respectively driven in the time periods T51-T54. Moreover, the enable signals GEN1, GEN2 are enabled alternately and enable periods of the enable signals GEN1, GEN2 do not overlap. Particularly, the enable signal GEN1 is enabled in the time periods T51, T53 and the enable signal GEN2 is enabled in the time periods T52, T54, so the word lines WL1, WL3 are driven by the reference circuit 12-1 in the time periods T51, T53, and the word lines WL2, WL4 are driven by the reference circuit 12-2 in the time periods T52, T54.

In the time period T51, the enable signal GEN1 is switched to be enabled (i.e., logic 1), so the switch SW1 is closed (conductive) for the reference node Nr to be driven by the reference voltage Vr11 generated by the reference circuit 12-1. Particularly, the top plate of the capacitor 121 of the reference circuit 12-1 is disconnected from the operating voltage terminal VDD and coupled to the reference node Nr.

Thus, the reference voltage Vr11 charged to the high voltage level VLH is provided to the reference node Nr.

In a time period T510 of the time period T51, the input signal IN1 is also switched to be enabled (logic 1), so the word line WL1 is coupled to the reference node Nr by the word line driver 14, and the reference voltage Vr11 is provided to the word line WL1. Because the top plate of capacitor 121 is floating, coupling the reference node Nr to the word line WL1 results in the charge stored by the capacitor 121 of the reference circuit 12-1 being shared with the equivalent capacitor CL1 on the word line WL1. During the charge sharing or the charge redistribution phase, the reference voltage Vr11 at the reference node Nr is lowered from the high voltage level VLH, while the voltage VWL1 on the word line WL1 is raised from the low voltage level VLL. When the charge sharing or the charge redistribution phase is completed at an end of the time period T510, the enabled voltage level VLE is reached by both of the reference voltage Vr11 at the reference node Nr and the voltage VWL1 on the word line WL1, so the memory cells MCs at the word line WL1 are controlled to be accessible under the enabled voltage level VLE.

In a time period T511 after the time period T510, the enable signal KEN is switched from logic 0 to logic 1, which enables the bias circuit 13 and the reference voltage Vr2 to be provided to the reference node Nr. More particularly, the reference voltage Vr2 generated by the bias circuit 13 is at the same enabled voltage level VLE of the reference voltage Vr11 that the reference circuits 12-1 generated. Therefore, after the enabled voltage level VLE is reached by the voltage VWL1 on the word line WL1, the bias circuit 13 is enabled to stabilize or regulate the voltage VWL1 by providing the reference voltage Vr2 at the same enabled voltage level VLE of the reference voltage Vr11.

After the time period T51, the enable signal GEN1 is switched to logic 0 while the enable signal GEN2 is raised to logic 1, and a time period T52 is entered. Additionally, the input signal IN2 is raised to logic 1 as well. As a result, the word line WL2 is driven by the reference circuit 12-2 with the reference voltage Vr12 in the time period T52.

In a time period T520 similar to the time periods T510, the enabled voltage level VLE is reached by the reference voltage Vr12 and the voltage VWL2 through charge sharing. Then, in a time period T521, the bias circuit 13 is enabled by the enable signal KEN to regulate the voltage VWL2 by providing the reference voltage Vr2 at the same enabled voltage level VLE as the reference voltage Vr12.

In the following time periods T53 and T54, the input signals IN3 and IN4 are respectively switched to be enabled, so the word line driver 14 is controlled to drive the word line WL3, WL4 in the respective time periods T53 and T54. In brief, similar processes are repeated by the reference circuits 12-1 and 12-2 to provide and lower the reference voltages Vr11, Vr12 at the enabled voltage level VLE to the reference node Nr in the time periods T530, T540, and by the bias circuit 13 to provide the reference voltage Vr2 at the same enabled voltage VLE in the time periods T531, T541.

Therefore, the reference circuits 12-1, 12-2 may be enabled alternately to drive different word lines. While one of the reference circuits 12-1 and 12-2 is charging or resetting, another one of the reference circuits 12-1 and 12-2 is utilized for providing the reference voltage Vr11 or Vr12 to the reference node Nr. Thus, data throughput of the memory system 5 may be increased due to arranging the reference circuits 12-1, 12-2 to output the reference voltages Vr11, Vr12 in parallel.

Figure 6:
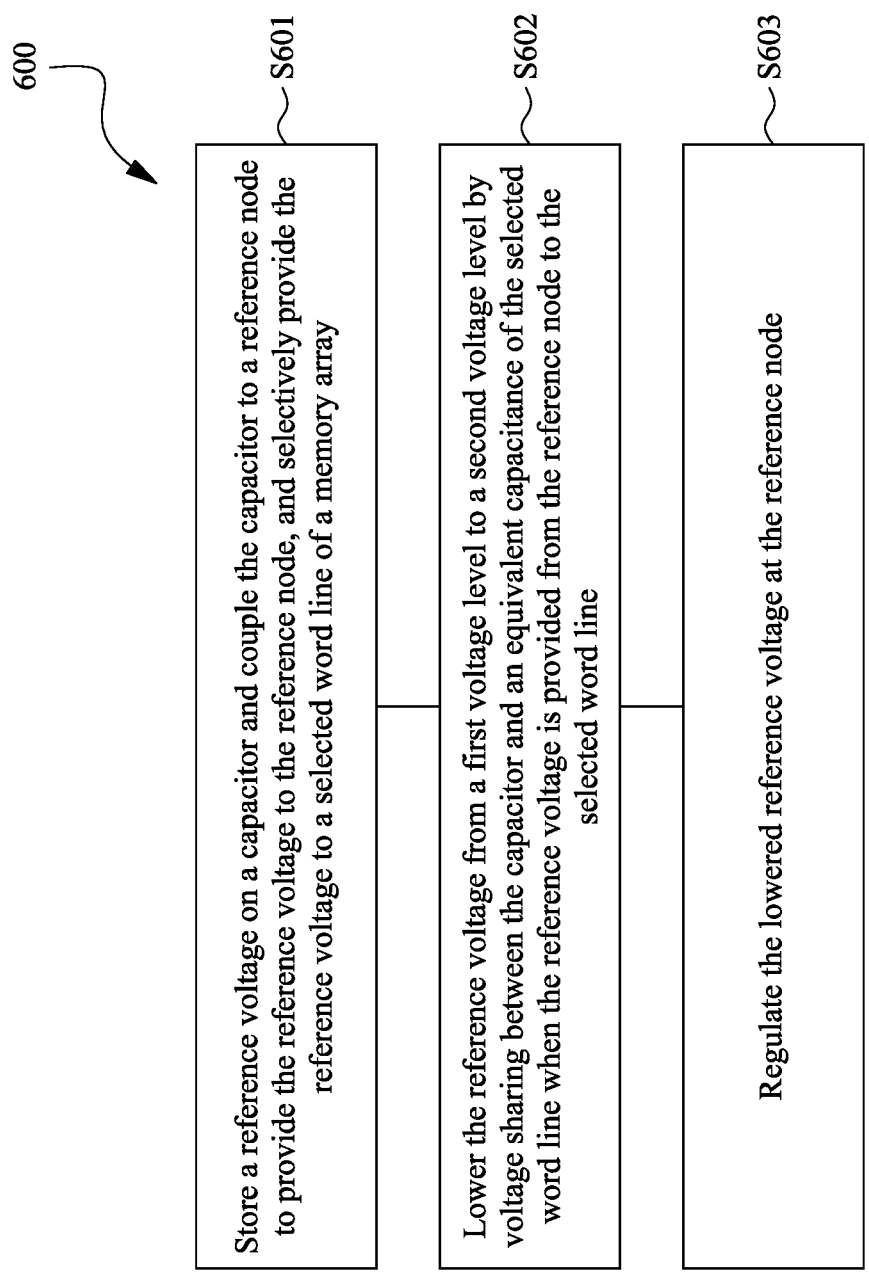
FIG. 6 illustrates an operating method, in accordance with some embodiments.

FIG. 6 illustrates an operating method 600, in accordance with some embodiments. The operating method 600 may be applied in the memory systems 1, 1a, and 5 to operate the memory array 10 as depicted in FIGS. 1, 2A, 5A. The operating method 600 includes steps S601-S603.

In step S601, a reference voltage is stored on a capacitor and the capacitor is coupled to a reference node to provide the reference voltage to the reference node, the reference voltage being selectively provided to a selected word line of a memory array. In step S602, the reference voltage is lowered from a first voltage level to a second voltage level by voltage sharing between the capacitor and an equivalent capacitance of the selected word line when the reference voltage is provided from the reference node to the selected word line of the plurality of word lines in the memory array 100. In step S603, the lowered reference voltage is regulated at the reference node.

For example, in step S601, the memory system 1a as depicted in FIG. 2A stores the reference voltage Vr1 on the capacitor 121 of the reference circuit 12a. The capacitor 121 is coupled to the reference node Nr, and further coupled to a selected word line of the memory array 10a based on control by the word line driver 14a. As such, the reference voltage Vr1 stored on the capacitor 121 is selectively provided to the selected word line.

In step S602, when the word line driver 14a is controlled by an input signal corresponding to the selected word line to couple the reference node Nr to the selected word line, the reference voltage Vr1 is provided from the reference node Nr to the selected word line. Meanwhile, the reference node Nr is disconnected by the reference circuit 12a from the operating voltage terminal VDD to enable lowering the reference voltage Vr1 at the reference node Nr from the voltage level VLH at the operating voltage terminal VDD to the enabled voltage level VLE through charge sharing, so the memory cells MCs coupled to the selected word line may be enabled by the lowered reference voltage Vr1 for accessing data. More particularly, a ratio of the enabled voltage level VLE to the voltage level VLH at the operating voltage terminal VDD is proportional to a ratio of a capacitance of the capacitor 121 to a sum of the capacitance of the capacitor 121 and the equivalent capacitance of the selected word line.

In step S603, the bias circuit 13a may be enabled after the reference voltage is provided from the reference node Nr to the selected word line, so a reference voltage Vr2 is provided to the reference node Nr for regulating the voltage on the selected word line at the enabled voltage level VLE. More particularly, the bias circuit 13a is configured to provide the reference voltage Vr2 through voltage division. To regulate the voltage on the selected word line at the enabled voltage VLE, a ratio of the on-resistance of the PMOS 131 divided by a sum of the on-resistances of the PMOSs 130, 131 is selected to be equal to the ratio of the capacitance of the capacitor 121 to the sum of the capacitance of the capacitor 121 and the equivalent capacitance of the selected word line.

In an embodiment, a memory driver includes a word line driver circuit, a reference circuit, and a bias circuit. The word line driver circuit is coupled to a word line and configured to selectively provide a reference voltage from a reference node to the word line according to an input signal. The reference circuit has a capacitor coupled to the reference node. The reference circuit is configured to store the reference voltage on the capacitor and lower the reference voltage from a first voltage level to a second voltage level when the reference voltage is provided by the word line driver circuit from the reference node to the word line. The bias circuit is coupled to the reference node and configured to regulate the reference voltage at the reference node by the second voltage level.

In an embodiment, a memory system includes a memory array and a memory driver. The memory array includes a plurality of memory cells controlled by a plurality of word lines. The memory driver includes a word line driver circuit, a reference circuit, and a bias circuit. The word line driver circuit is coupled to the plurality of word lines and configured to selectively provide a reference voltage from a reference node to a selected word line of the plurality of word lines according to an input signal. The reference circuit includes a capacitor coupled to the reference node. The reference circuit is configured to store the reference voltage on the capacitor, to cause charge sharing according to a capacitance of the capacitor and an equivalent capacitance of the selected word line when the reference voltage is provided by the word line driver circuit from the reference node to the selected word line. The bias circuit is coupled to the reference node and configured to regulate the reference voltage after the reference voltage is provided from the reference node to the selected word line.

In an embodiment, an operating method is utilized for operating a memory array. The memory array comprises a plurality of memory cells controlled by a plurality of word lines. The operating method includes: storing a reference voltage on a capacitor and coupling the capacitor to a reference node to provide the reference voltage to the reference node; selectively providing the reference voltage to a selected word line of the plurality of word lines; lowering the reference voltage from a first voltage level to a second voltage level by voltage sharing between the capacitor and an equivalent capacitance of the selected word line when the reference voltage is provided from the reference node to the selected word line of the plurality of word lines; and regulating the lowered reference voltage at the reference node.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory driver, comprising:
   a word line driver circuit coupled to a word line and configured to selectively provide a reference voltage from a reference node to the word line according to an input signal;
   a reference circuit having a capacitor coupled to the reference node, the reference circuit being configured to store the reference voltage on the capacitor and lower the reference voltage from a first voltage level to a second voltage level when the reference voltage is provided by the word line driver circuit from the reference node to the selected word line; and
   a bias circuit coupled to the reference node and configured to regulate the lowered reference voltage at the reference node.

2. The memory driver of claim 1, wherein after the reference voltage is lowered to the second voltage level by the reference circuit, the bias circuit is enabled to regulate the reference voltage at the reference node.

3. The memory driver of claim 1, wherein when the reference voltage is provided by the word line driver circuit from the reference node to the word line, the word line is coupled to the reference node by the word line driver.

4. The memory driver of claim 1, wherein a ratio of the second voltage level to the first voltage level is positively related to a ratio of a capacitance of the capacitor to a sum of the capacitance of the capacitor and an equivalent capacitance of the word line.

5. The memory driver of claim 1, wherein the reference circuit is configured to charge the capacitor at the reference node with an operating voltage, the reference circuit further comprises:
   a bias string coupled in parallel to the capacitor to limit a voltage across the capacitor at the first voltage level.

6. The memory driver of claim 5, wherein the bias string comprises a plurality of complementary metal-oxide-silicon (CMOS) transistors, each CMOS transistor being diode-connected and the plurality of CMOS transistors being coupled in series between ends of the capacitor, the first voltage level being limited by the bias string to be less than or equal to a sum of threshold voltages of the plurality of CMOS transistors.

7. The memory driver of claim 6, further comprising:
   a voltage trimming circuit coupled to the bias string and configured to adjust a total number of the plurality of CMOS transistors serially coupled in the bias string.

8. The memory driver of claim 7, wherein the voltage trimming circuit comprises a switch coupled in parallel with a first CMOS transistor of the plurality of CMOS transistors, so the first CMOS transistor is bypassed when the switch is closed.

9. The memory driver of claim 1, further comprising:
a capacitor trimming circuit coupled in parallel with the capacitor and configured to adjust a total capacitance coupled to the reference node.

10. The memory driver of claim 9, wherein the capacitor trimming circuit comprises a switch coupled in series with a trimming capacitor, a series combination of the switch and the trimming capacitor is coupled in parallel with the capacitor, and the total capacitance coupled to the reference node is adjusted to a sum of the capacitance of the capacitor and a capacitance of the trimming capacitor when the switch is closed.

11. A memory system, comprising:
a memory array comprising a plurality of memory cells controlled by a plurality of word lines; and
a memory driver, comprising:
a word line driver circuit coupled to the plurality of word lines and configured to selectively provide a reference voltage from a reference node to a selected word line of the plurality of word lines according to an input signal;
a reference circuit comprising a capacitor coupled to the reference node, the reference circuit being configured to store the reference voltage on the capacitor, to cause charge sharing according to a capacitance of the capacitor and an equivalent capacitance of the selected word line when the reference voltage is provided by the word line driver circuit from the reference node to the selected word line; and
a bias circuit coupled to the reference node and configured to regulate the reference voltage after the reference voltage is provided from the reference node to the selected word line.

12. The memory system of claim 11, wherein the reference voltage is lowered from a first voltage level to a second voltage level through the charge sharing, a ratio of the second voltage level to the first voltage level is proportional to a ratio of a capacitance of the capacitor to a sum of the capacitance of the capacitor and the equivalent capacitance of the selected word line.

13. The memory system of claim 12, wherein the bias circuit comprises a first switch and a second switch, the first switch is coupled between the reference node and an operating voltage terminal, and the second switch is coupled between the reference node and a ground voltage terminal, both the first switch and the second switch configured to close in response to an enable signal, and
the bias circuit is configured to generate the reference voltage at the second voltage level through voltage division when the enable signal is enabled.

14. The memory system of claim 13, wherein a first equivalent resistor between the reference node and the operating voltage terminal has a first resistance, and a second equivalent resistor between the reference node and the ground voltage terminal has a second resistance, and
a ratio of the second resistance to a sum of the first resistance and the second resistance equals a ratio of the second voltage level to the first voltage level.

15. The memory system of claim 13, further comprising a resistance trimming circuit including a third switch and a fourth switch, the third switch and the fourth switch being coupled in series between the reference node and the ground voltage terminal, the third switch being controlled by a trimming signal and the fourth switch is controlled by the enable signal,
wherein the resistance trimming circuit is configured to adjust an equivalent resistance coupled between the reference node and the ground voltage terminal when the trimming signal is enabled.

16. The memory system of claim 12, wherein the bias circuit comprises a bias string coupled between the reference node and a ground voltage terminal, the bias string comprises a plurality of complementary metal-oxide-silicon (CMOS) transistors, each CMOS transistor being diode-connected and the plurality of CMOS transistors being coupled in series between the reference node and the ground voltage terminal, the second voltage level being limited by the bias string to be less than or equal to a sum of threshold voltages of the plurality of CMOS transistors.

17. The memory system of claim 16, further comprising:
a voltage trimming circuit coupled to the bias string and configured to adjust a total number of the plurality of CMOS transistors serially coupled in the bias string.

18. The memory system of claim 11, wherein the capacitor is a first capacitor, the reference circuit comprises:
a first reference circuit comprising the first capacitor, the first reference circuit being enabled by a first enable signal to provide a first reference voltage to the reference node, and lower the first reference voltage when the first reference voltage is provided by the word line driver circuit from the reference node to a first selected word line of the plurality of word lines; and
a second reference circuit comprising a second capacitor, the second reference circuit being enabled by a second enable signal to provide a second reference voltage to the reference node, and lower the second reference voltage when the second reference voltage is provided by the word line driver circuit from the reference node to a second selected word line of the plurality of word lines.

19. An operating method for operating a memory array, the memory array comprising a plurality of memory cells controlled by a plurality of word lines, the operating method comprising:
storing a reference voltage on a capacitor and coupling the capacitor to a reference node to provide the reference voltage to the reference node;
selectively providing the reference voltage to a selected word line of the plurality of word lines;
lowering the reference voltage from a first voltage level to a second voltage level by voltage sharing between the capacitor and an equivalent capacitance of the selected word line when the reference voltage is provided from the reference node to the selected word line of the plurality of word lines; and
regulating the lowered reference voltage at the reference node.

20. The operating method of claim 19, wherein a ratio of the second voltage level to the first voltage level is positively related to a ratio of a capacitance of the capacitor to a sum of the capacitance of the capacitor and an equivalent capacitance of the selected word line.

* * * * *